United States Patent
Solomon et al.

(10) Patent No.: US 6,566,256 B1
(45) Date of Patent: May 20, 2003

(54) DUAL PROCESS SEMICONDUCTOR HETEROSTRUCTURES AND METHODS

(75) Inventors: Glenn S. Solomon, Redwood City; David J. Miller, Belmont; Tetsuzo Ueda, Menlo Park, all of CA (US)

(73) Assignees: GBL Technologies, Inc., Redwood City, CA (US); Matsushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 09/293,620

(22) Filed: Apr. 16, 1999

(51) Int. Cl.$^7$ .............................................. H01L 21/44
(52) U.S. Cl. ........................ 438/680; 438/758; 438/22; 438/44; 438/47; 438/681
(58) Field of Search ............................... 257/79, 84, 85; 438/22, 24, 46, 47, 758

(56) References Cited

U.S. PATENT DOCUMENTS

| | | | |
|---|---|---|---|
| 4,404,265 A | | 9/1983 | Manasevit .................. 428/689 |
| 4,533,410 A | | 8/1985 | Ogura et al. ................ 148/175 |
| 4,855,249 A | * | 8/1989 | Akasaki et al. ............... 437/81 |
| 4,988,640 A | | 1/1991 | Bohling et al. ............... 437/81 |
| 5,227,328 A | | 7/1993 | Khan et al. ................... 437/82 |
| 5,290,393 A | * | 3/1994 | Nakamura .................. 156/613 |
| 5,468,678 A | * | 11/1995 | Nakamura et al. .......... 437/107 |
| 5,587,014 A | * | 12/1996 | Iyechika et al. ............. 117/90 |
| 5,729,029 A | * | 3/1998 | Rudaz .......................... 257/613 |
| 5,744,375 A | * | 4/1998 | Kao et al. .................... 437/133 |
| 5,770,887 A | * | 6/1998 | Tadatomo et al. .......... 257/613 |
| 5,810,925 A | * | 9/1998 | Tadatomo et al. ............. 117/90 |
| 5,814,239 A | * | 9/1998 | Kaneko et al. ................. 216/63 |
| 5,875,052 A | * | 2/1999 | Shmagin et al. ............. 359/244 |
| 5,891,790 A | | 4/1999 | Keller et al. ................. 438/508 |
| 5,993,542 A | | 11/1999 | Yanashima et al. ........... 117/84 |
| 6,023,077 A | * | 2/2000 | Iyechika et al. ............. 257/103 |
| 6,110,531 A | | 8/2000 | Paz de Araujo et al. .............. 427/225.25 |
| 6,156,581 A | * | 12/2000 | Vaudo et al. .................. 438/22 |
| 6,177,292 B1 | | 1/2001 | Hong et al. ................... 438/46 |
| 6,218,280 B1 | | 4/2001 | Kriliouk et al. ............. 438/607 |

* cited by examiner

Primary Examiner—Matthew Smith
Assistant Examiner—V. Yevsikov
(74) Attorney, Agent, or Firm—JDI Patent; Joshua D. Isenberg (57) ABSTRACT

A method for forming an epitaxial layer involves depositing a buffer layer on a substrate by a first deposition process, followed by deposition of an epitaxial layer by a second deposition process. By using such a dual process, the first and second deposition processes can be optimized, with respect to performance, growth rate, and cost, for different materials of each layer. A semiconductor heterostructure prepared by a dual deposition process includes a buffer layer formed on a substrate by MOCVD, and an epitaxial layer formed on the buffer layer, the epitaxial layer deposited by hydride vapor-phase deposition.

22 Claims, 5 Drawing Sheets

DUAL PROCESS SEMICONDUCTOR HETEROSTRUCTURES AND METHODS

BACKGROUND OF THE INVENTION

1. Field of the Invention

The present invention relates to the growth of epitaxial films. The invention also relates to the growth of a buffer layer on a substrate and the growth of an epitaxial film on the buffer layer. The invention further relates to the epitaxial deposition of heterostructures by more than one growth technique. The invention still further relates to a two stage, or dual, process for growing gallium nitride and related materials epitaxial layers.

2. Background of the Related Art

Gallium nitride (GaN) and its related nitrides, including AlN, InN and alloys of these materials, are emerging as important technological material. For example, GaN is currently used in the manufacture of blue light emitting diodes, semiconductor lasers, and other opto-electronic devices. However, it is currently impossible to fabricate bulk GaN crystals of usable size as substrates in semiconductor manufacturing. Thus, GaN films are made by deposition on a non-native substrate material, typically sapphire ($Al_2O_3$). However, a large lattice mismatch and thermal mismatch exists between the $Al_2O_3$ substrate and the GaN layer. As a result, the material has large dislocation densities, which limit the performance of devices fabricated from these films, and at the same time restricts the applications for such GaN structures.

According to a prior art method for growing higher-quality GaN films, a relatively thick layer of an intermediate material can first be grown on the substrate as a buffer layer, and the GaN layer can then be grown on the buffer layer. Defects in GaN layers grown directly on sapphire substrates are due to major differences in inter-atomic spacing (lattice constant) and coefficient of thermal expansion (CTE) between the substrate and GaN. Therefore, if the buffer layer has a lattice constant and CTE closer to those of GaN, the GaN (top) layer will have fewer defects, and will be of higher quality. High quality GaN layers are necessary for electronic and opto-electronic devices. A material which meets the desired lattice constant and CTE criteria is aluminum nitride (AlN).

Prior art methods of fabricating heterostructures, having a GaN layer on a buffer layer, have used the same growth technique for both layers. For example, both semiconductors (the AlN buffer layer and the GaN layer) can be grown by metal-organic chemical vapor deposition (MOCVD). In this technique, ammonia gas ($NH_3$) is reacted with a metallo-organic compound containing aluminum or gallium, such as trimethyl aluminum (TMA), triethyl aluminum (TEA), trimethyl gallium (TMG), or triethyl gallium (TEG). The reaction occurs at high temperatures in the vicinity of a substrate, and a solid product (GaN or AlN) is deposited on the substrate. However, this technique is not only expensive, but also slow. In particular, the metallo-organic source materials are costly, and they can only be delivered to the substrate for reaction at low rates.

A currently favored prior art technique for the growth of relatively thick layers, e.g., of GaN, is HVPE. In this process, growth proceeds due to the high-temperature vapor-phase reaction between gallium mono-chloride (GaCl) and ammonia. The ammonia is supplied from a standard gas source, while the GaCl is produced by passing hydrogen chloride (HCl) gas over a liquid gallium (Ga) supply. Using this method, GaN can be grown relatively quickly and inexpensively. Further, GaN grown at a fast rate may produce layers with less defect densities.

However, due to difficulties involved in providing a supply of aluminum chloride (AlCl), HVPE cannot be used for the efficient growth of an AlN buffer layer. (For example, when HCl is passed over Al metal, the AlCl that is formed immediately solidifies, and is not carried towards the substrate.) Consequently, AlN layers must be grown by techniques other than HVPE, such as MOCVD.

The above delineated disadvantages associated with prior art methods for deposition of AlN/GaN heterostructures are addressed by the present invention, in which a buffer layer (e.g., AlN) and an epitaxial layer (e.g., GaN) are grown using different techniques, as will be described fully hereinbelow.

SUMMARY OF THE INVENTION

In view of the above, it is an object of the present invention to provide a semiconductor heterostructure and method of making the same.

One feature of the invention is that it provides a two-stage process for fabricating a semiconductor heterostructure.

Another feature of the invention is that it provides a semiconductor heterostructure prepared by growing an epitaxial nitride layer on a buffer layer, the buffer layer deposited by a technique other than HVPE.

Another feature of the invention is that it provides a method of growing a semiconductor heterostructure, wherein a buffer layer is first grown on a substrate by metallo-organic chemical vapor deposition, and an epitaxial layer is subsequently grown on the buffer layer by hydride vapor-phase epitaxy.

Another feature of the invention is that it provides an epitaxial nitride layer formed on a substrate formed by MOCVD.

One advantage of the invention is that it provides a method for fabricating a semiconductor heterostructure by two different deposition processes, wherein each process is optimized for the material to be deposited.

Another advantage of the invention is that it provides an epitaxial layer formed by HVPE on a buffer layer formed by MOCVD.

Another advantage of the invention is that it provides an efficient method for forming an epitaxial nitride layer suitable for electronic and opto-electronic devices.

These and other objects, advantages and features are accomplished by the provision of a method of making a semiconductor heterostructure, including the steps of: a) providing a substrate; b) forming a buffer layer on the substrate to form a buffer-layered substrate; c) forming a cap layer on the buffer layer; and d) forming an epitaxial layer on the cap layer, wherein the buffer layer is formed by MOCVD, MBE or other suitable CVD techniques, and the epitaxial layer is formed by HVPE or other suitable techniques.

These and other objects, advantages and features are accomplished by the provision of a semiconductor heterostructure, including: a buffer layer, said buffer layer formed by MOCVD; and an epitaxial layer disposed on said buffer layer, said epitaxial layer formed by HVPE.

These and other objects, advantages and features are accomplished by the provision of an epitaxial layer prepared according to a method including the following steps: a) forming a buffer layer on a substrate by MOCVD , MBE, sputtering or other suitable CVD techniques; b) forming a cap layer on the buffer layer; and c) forming an epitaxial layer on the cap layer by hydride vapor-phase epitaxy.

These and other objects, advantages and features of the invention will be set forth in part in the description which follows and in part will become apparent to those having ordinary skill in the art upon examination of the following or may be learned from practice of the invention. The advantages of the invention may be realized and attained as particularly pointed out in the appended claims.

DETAILED DESCRIPTION OF THE PREFERRED EMBODIMENTS

For purposes of illustration, the invention will be described primarily in relation to the fabrication of a heterostructure having a GaN epitaxial layer deposited on an AlN buffer layer, wherein the buffer layer is deposited by MOCVD. However, it is to be understood that the invention is also applicable to the deposition of materials other than GaN, and to deposition of buffer layers by techniques other than MOCVD, such as, but not limited to MBE or sputtering.

Figure 1:
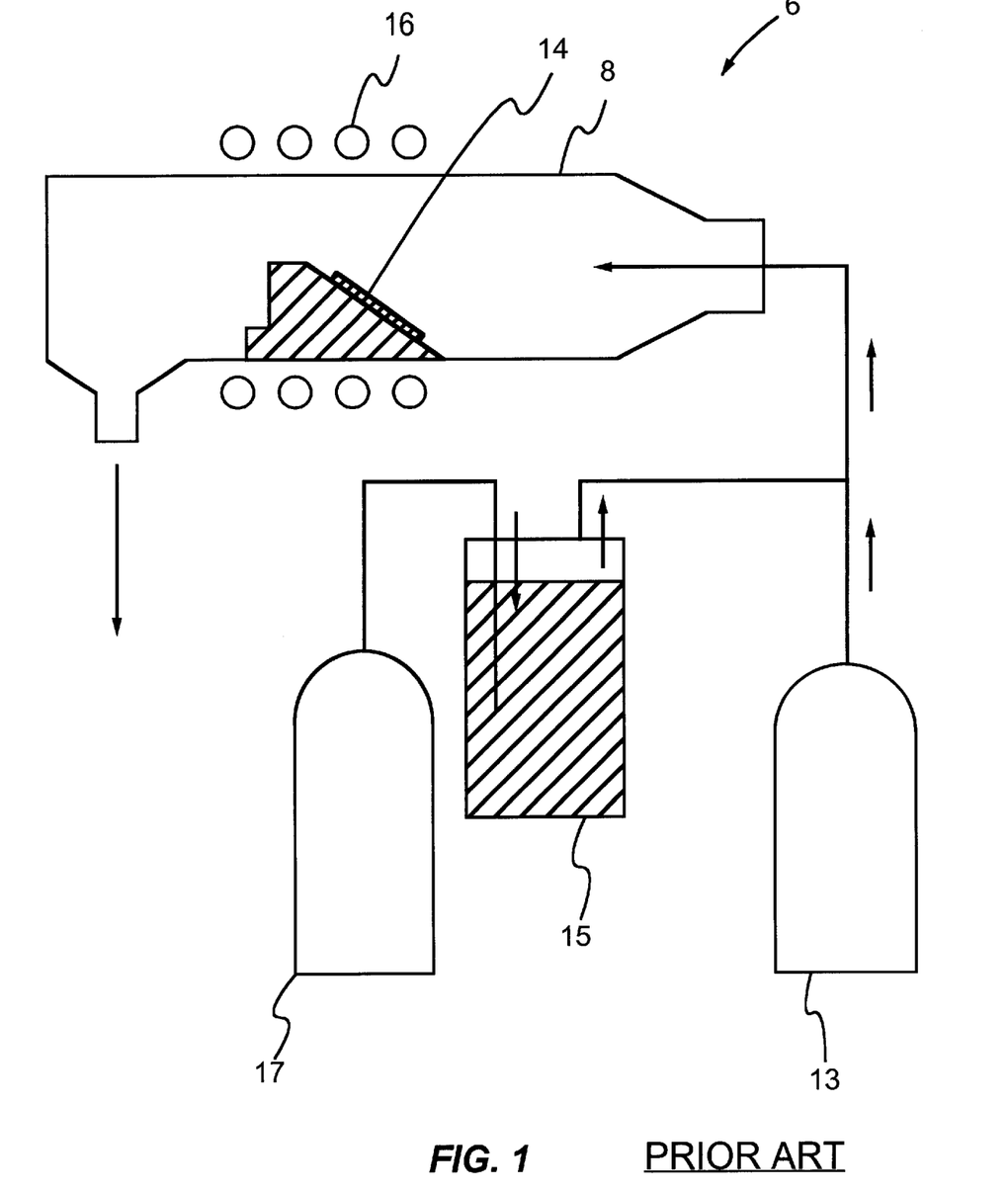
FIG. 1 schematically represents a MOCVD system suitable for forming a cap layer and a buffer layer on a substrate during a first deposition process.

Referring now to the drawings, FIG. 1 schematically represents a MOCVD system 6 suitable for depositing at least a buffer layer on a substrate during a first deposition process of the invention. According to a currently preferred embodiment of the invention, system 6 may also be used for depositing a cap layer on buffer layer 2 (FIGS. 3A–3D). MOCVD systems of the type schematically represented in FIG. 1 are well known in the art. Briefly, system 6 includes a chamber 8, at least part of which is surrounded by a heating unit 16. A substrate 14, arranged within chamber 8, is heated by means of heating unit 16. Ammonia is provided from a standard gas source 13. Vapor of a metallo-organic compound is supplied by passing a carrier gas 17, typically nitrogen or hydrogen, through a liquid supply of the metallo-organic compound contained within a bubbler 15. The metallo-organic compound is an aluminum- or gallium containing metallo-organic compound, such as trimethyl aluminum (TMA), triethyl aluminum (TEA), trimethyl gallium (TMG), or trimethyl gallium (TEG). The metallo-organic compound supply is heated, and the flow of carrier gas 17 is regulated to provide a stream of gas which is saturated with vapor of the metallo-organic compound. The ammonia and the vapor of the metallo-organic compound are introduced into chamber 8. Deposition of AlN or GaN occurs at the surface of substrate 14 due to the high temperature vapor-phase reaction of the metallo-organic compound with the ammonia gas. Naturally, for the deposition of AlN (e.g., a buffer layer 2, FIG. 3B) the metallo-organic (or organo-metallic) compound in bubbler 15 is an aluminum-containing organo-metallic, while for the deposition of GaN (e.g., a cap layer 3, FIG. 3C) the organo-metallic compound in bubbler 15 is a gallium-containing organo-metallic.

Figure 2:
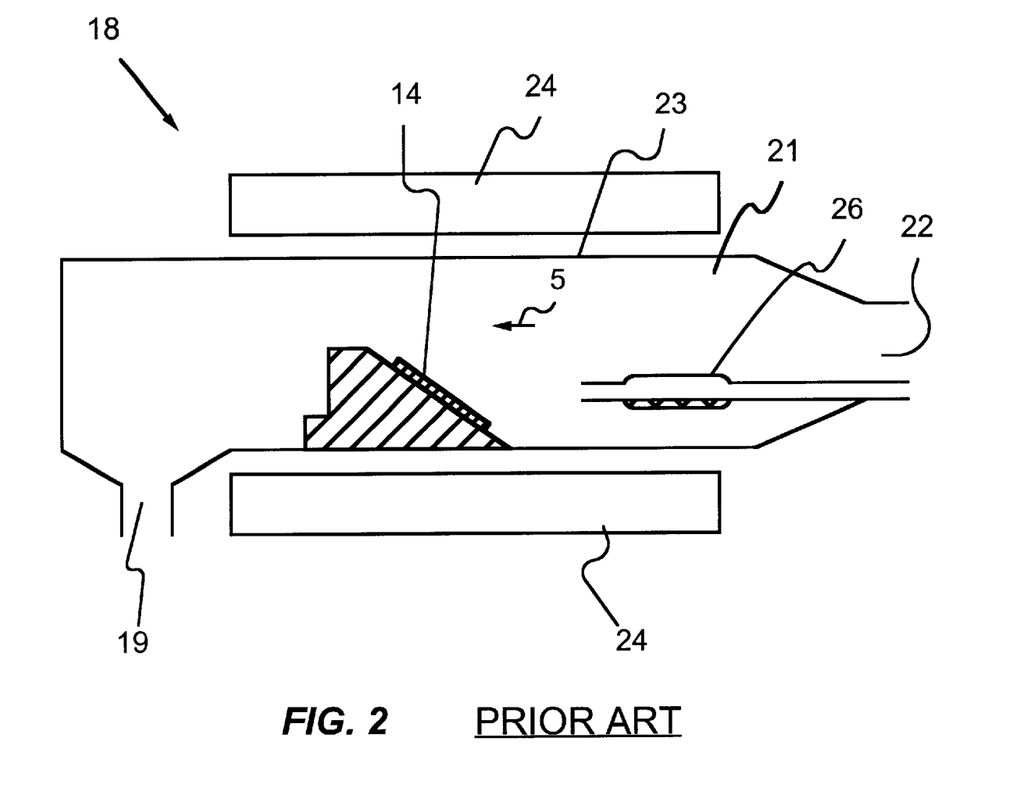
FIG. 2 schematically represents a HVPE system suitable for forming an epitaxial layer on a buffer layer during a second deposition process.

FIG. 2 schematically represents a HVPE system 18 suitable for forming an epitaxial layer 4 on a buffer layer 2, or cap layer 3, (FIGS. 3B–3D) during a second deposition process of the invention. HVPE systems (e.g., 18) suitable for forming an epitaxial layer during a second deposition process of the invention are well known in the art. Briefly, system 18 includes a growth tube or reactor 21 having wall 23, inlet 22, and outlet 19, and a GaCl delivery system 26. System 18 may be contained entirely within a heat source, e.g., a furnace 24. Epitaxial deposition on heated substrate 14 proceeds by the vapor-phase reaction of source or reagent gases which are introduced into reactor 21. For example, a reagent gas, such as gallium monochloride and indium monochloride, may be projected towards substrate 14 via reaction assembly 26; while ammonia may be introduced into growth tube 21 through reactor inlet 22. Reagent gas, e.g. GaCl, may be formed in reaction assembly 26 by passing HCl over liquid metal (e.g., gallium) at high temperatures. The direction of gas flow is indicated by arrow 5. Reagent gases (e.g., GaCl and InCl) react with ammonia within growth tube 21 to form the respective nitride, GaN and InN, which is deposited on substrate 14.

HVPE is a much more cost-effective technique for GaN deposition than is MOCVD, the latter technique requiring costly metallo-organic reagents an multiple temperature devices for each reagent source. In addition, a larger growth rate of the nitride epitaxial layer can be achieved using a HVPE system as compared with an MOCVD system. This is so because, in the case of the former system, Ga can be supplied to the substrate more quickly.

Figure 3A:
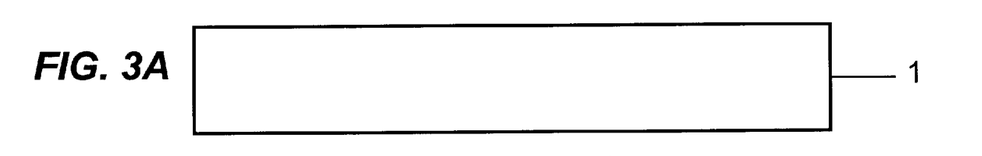
FIGS. 3A, 3B, 3C, and 3D represent sequential stages in fabrication of a semiconductor heterostructure, according to the invention.

FIGS. 3A, 3B, 3C, and 3D represent stages in fabrication of a semiconductor heterostructure, according to the invention. FIG. 3A represents a substrate 1. Materials suitable, generally for the fabrication of semiconductor devices are well known in the art. However, according to the invention, substrate 1 is preferably a material such as sapphire, silicon, silicon carbide, and gallium arsenide, zinc oxide, magnesium oxide, or the like.

Figure 3B:
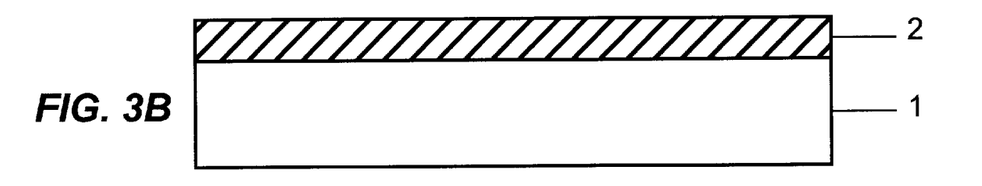

FIG. 3B represents a buffer layer 2 formed on substrate 1. According to the invention, buffer layer 2 is formed on substrate 1 by MOCVD, chemical vapor deposition (CVD), molecular beam epitaxy (MBE) or sputtering. Each of these techniques are well known in the art. Buffer layer 2 may be deposited on substrate 1 to a thickness in the range of 1.0 nanometer to about 1.0 Micron. According to a currently preferred embodiment of the invention, buffer layer 2 is formed on substrate 1 by MOCVD. Preferably, buffer layer 2 includes AlN, GaAlN, InGaN or GaN.

Figure 3C:
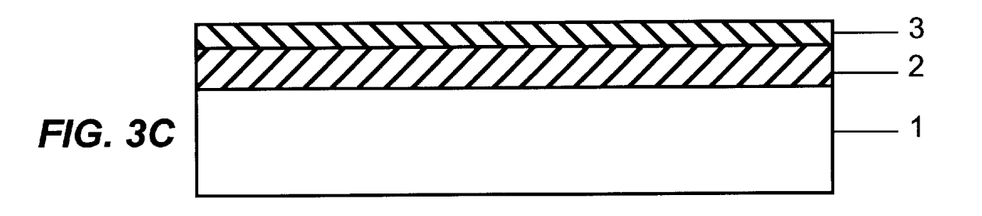

FIG. 3C represents a cap layer 3 formed on buffer layer 2. According to the invention, cap layer 3 is formed on buffer layer 2 by MOCVD, CVD, or MBE. According to a currently preferred embodiment of the invention, cap layer 3 is formed on buffer layer 2 by MOCVD. Preferably, cap layer 3 is formed using the same process and system as that used for forming buffer layer 2, with the exception that a different organo-metallic reagent may be used in bubbler 15. Preferably the cap layer 3 is formed on the buffer layer 2 in a continuous fashion over the buffer layer 2 to eliminate surface degradation of the buffer layer 2.

Cap layer 3 preferably includes a nitride of an element of groups III or IV of the periodic table. More preferably, cap layer 3 includes GaN. Cap layer 3 serves to protect buffer layer 2 against degradation and exposure to the atmosphere upon removal from chamber 8 of MOCVD system 6 (FIG. 1). Cap layer 3 may be deposited on buffer layer 2 to a thickness of 1.0 Nanometer to 1000 Nanometer. In situations where an inert (e.g., dry, oxygen-depleted) atmosphere is provided, a cap layer 3 may be unnecessary.

Figure 3D:
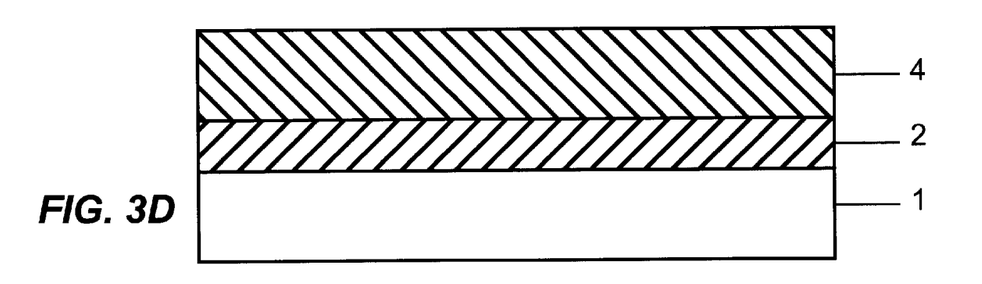

FIG. 3D represents an epitaxial layer 4 formed on buffer layer 2. Epitaxial layer 4 has the same composition as cap layer 3 (FIG. 3C), and cap layer 3 therefore merges with, or is integrated with, epitaxial layer 4. However, whereas cap layer 3 is formed MOCVD, CVD, or MBE, epitaxial layer 4 is formed by HVPE (e.g., using system 18, FIG. 2). Epitaxial layer 4 may be deposited on substrate 1 to any thickness, but is typically deposited to a thickness in the range of about 1.0 Micron to about 500 Micron (inclusive of cap layer 3 integrated with layer 4). According to a currently preferred embodiment of the invention, epitaxial layer 4 includes GaN. Epitaxial layer 4 and buffer layer 2 preferably have a combined thickness in the range of about 1.0 Micron to about 500 Micron.

Figure 4A:
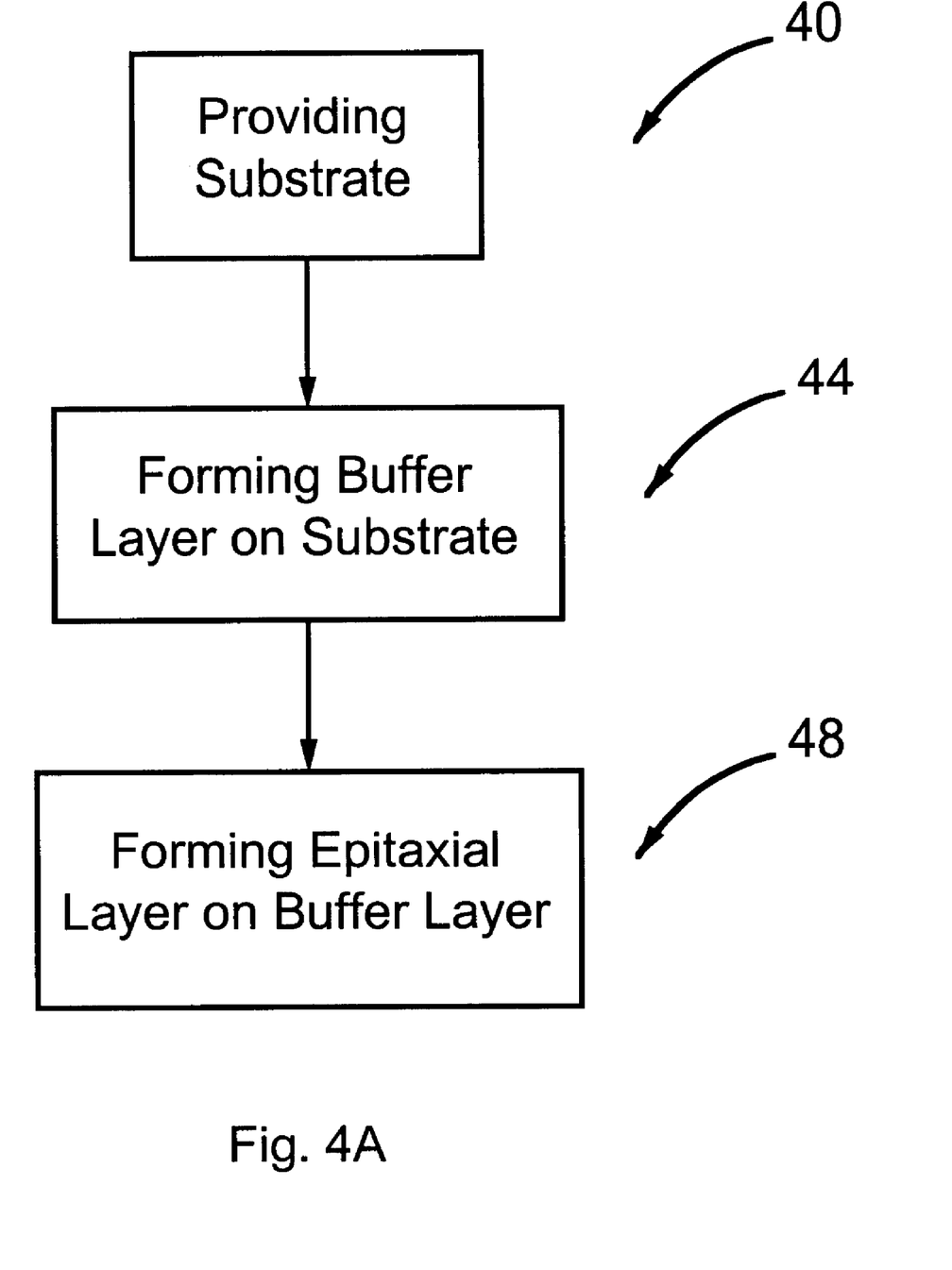
FIG. 4A schematically represents a series of steps involved in a method of making a semiconductor heterostructure, according to the invention.

FIG. 4A schematically represents a series of steps involved in a method of making a semiconductor heterostructure, according to the invention, in which step 40 involves providing a substrate. The substrate provided in step 40 is preferably a substrate composed of a material such as sapphire, silicon, silicon carbide, or gallium arsenide. Step 44 involves forming a buffer layer on the substrate to provide a buffer-layered substrate. The buffer layer may be formed on the substrate by a first deposition process of the method, such as MOCVD, CVD, or MBE. The first deposition process of step 44 is optimized specifically for the particular component(s) of the buffer layer.

The buffer layer deposited in step 44 preferably includes a material having lattice constant and CTE values similar to those of an epitaxial layer to be formed on the buffer layer (step 48, hereinbelow). The buffer layer formed in step 44 preferably has a thickness in the range of about 1.0 nanometer to about 1.0 micron. Step 48 involves forming the epitaxial layer on the buffer layer. The epitaxial layer formed in step 48 is formed by a second deposition process, wherein the second deposition process is optimized specifically for the particular component(s) of the epitaxial layer. The components of the epitaxial layer preferably include a nitride of an element of group III or IV of the periodic table, or a mixture of two or more such nitrides. According to a currently preferred embodiment, the epitaxial layer deposited on the buffer layer includes GaN and is formed by HVPE.

Figure 4B:
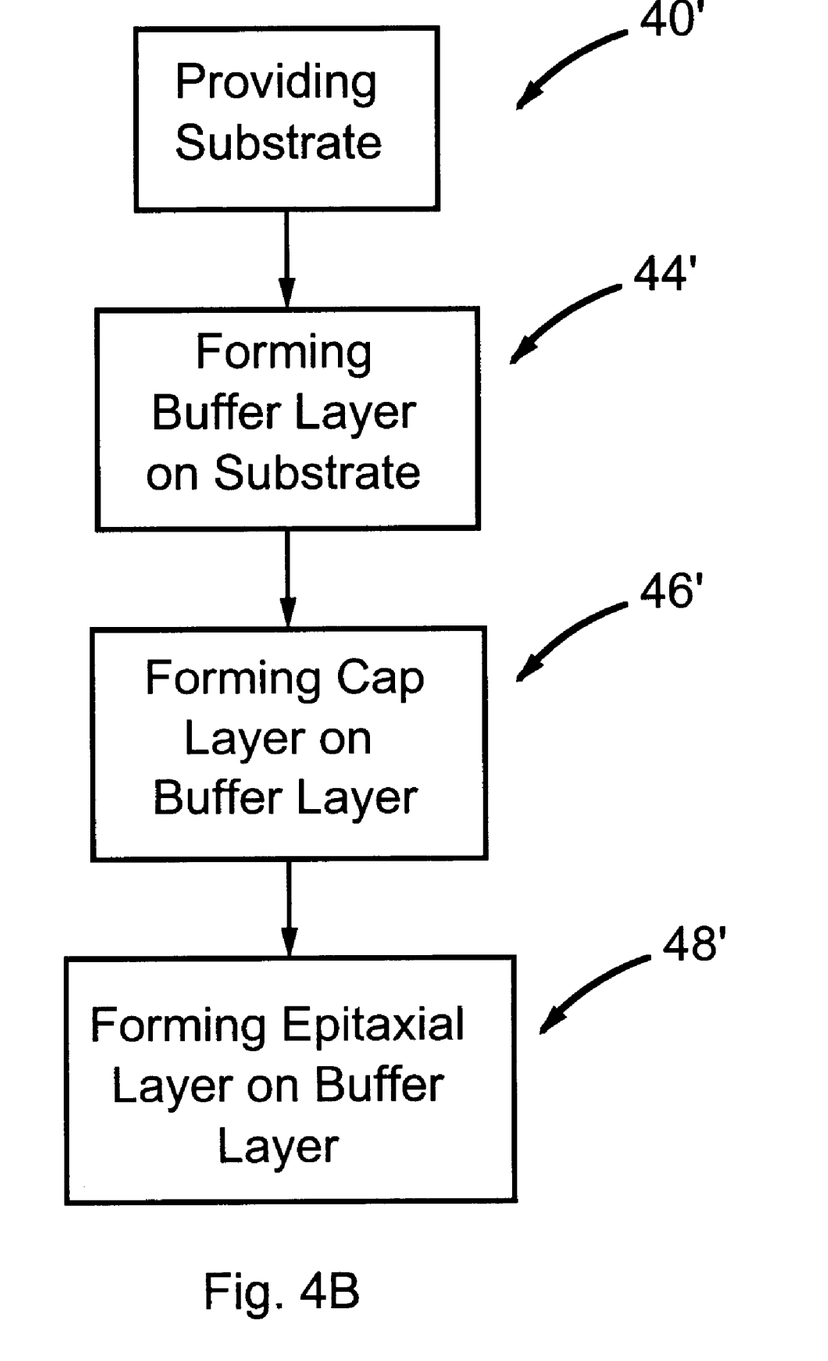
FIG. 4B schematically represents a series of steps involved in a method of making a semiconductor heterostructure, according to another embodiment of the invention.

FIG. 4B schematically represents a series of steps involved in a method of making a semiconductor heterostructure, according to another embodiment of the invention, in which steps 40' and 44' are analogous to steps 40 and 44 described hereinabove with reference to FIG. 4A. After step 44', a cap layer may be formed on the buffer layer. The cap layer serves to protect the buffer layer from exposure of the buffer layer to the atmosphere prior to deposition of an epitaxial layer on the buffer layer. The cap layer may be formed on the buffer layer by a deposition process such as MOCVD, CVD, or MBE. Preferably, the cap layer is formed on the buffer layer by the same deposition process as is used for forming the buffer layer in step 44'. Preferably, the material deposited to form the cap layer is the same as the material to be deposited to form the epitaxial layer in a subsequent step (step 48'), such that the cap layer is integrated with the epitaxial layer. However, the epitaxial layer formed in step 48' is deposited by a second deposition process, preferably HVPE.

By using different deposition processes for forming the buffer and epitaxial layers, each deposition process can be optimized for the particular material to be deposited. According to a currently preferred embodiment of the invention, the cap and epitaxial layers are GaN, and are formed on a buffer layer of AlN.

After formation of the epitaxial layer on the buffer layer, the epitaxial layer and/or the buffer layer may be removed from the substrate as a combined epitaxial layer/buffer layer heterostructure. Further, any portion of the heterostuctures described herein may be removed after the deposition processes. The epitaxial layer/buffer layer heterostructure may then itself serve as a platform or substrate for further deposition and/or device processing.

For purposes of illustration, the invention has been described primarily in relation to a semiconductor heterostructure having a GaN epitaxial layer deposited on an AlN buffer layer, wherein the buffer layer is deposited by MOCVD and the GaN layer is deposited by HVPE. However, the invention is also applicable to deposition techniques other than MOCVD, and to the deposition of epitaxial layers other than GaN. For example, buffer layers may be deposited by CVD or MBE; and epitaxial layers may be formed from nitrides of other elements of groups III and IV of the periodic table.

The foregoing embodiments are merely exemplary and are not to be construed as limiting the present invention. The present teaching may be applied to other types of apparatuses and methods. The description of the present invention is intended to be illustrative, and not to limit the scope of the appended claims. Many alternatives, modifications, and variations will be apparent to those skilled in the art.

What is claimed is:

1. A method of making a semiconductor heterostructure, comprising the steps of:
   a) providing a substrate;
   b) forming a nitride buffer layer on the substrate to form a buffer-layer substrate, wherein the buffer layer is formed by metal-organic chemical vapor deposition (MOCVD); and
   c) forming a nitride epitaxial layer on the buffer layer, wherein the epitaxial layer is deposited by hydride vapor phase epitaxy (HVPE).

2. The method of claim 1, wherein the epitaxial layer comprises a nitride of an element of groups III and IV of the periodic table.

3. The method of claim 1, wherein the substrate comprises a material selected from the group consisting of sapphire, silicon, silicon carbide, and gallium arsenide, and the buffer layer is comprised of a material selected from the group consisting of aluminum nitride, ZnO, MgO and GaN.

4. The method of claim 1, wherein the epitaxial layer comprises metal nitride comprising at least one metal selected from the group consisting of gallium, aluminum and indium.

5. The method of claim 1, wherein the buffer layer has a thickness in the range of 1.0 nanometer to 1.0 micron.

6. The method of claim 1, wherein the epitaxial layer has a thickness of at least 1 micron to 500 micron.

7. The method of claim 1, wherein said step b) is performed in a MOCVD chamber, and said step c) is performed in a HVPE reactor, and said method further comprises the steps of:

f) after said step b), removing the buffer-layered substrate from the MOCVD chamber; and g) arranging the buffer-layered substrate in the HVPE reactor.

8. A method of making a semiconductor heterostructure, comprising the steps of:

a) providing a substrate;

b) forming a buffer layer on the substrate to form a buffer-layered substrate;

c) forming a cap layer on the buffer layer; and d) forming an epitaxial layer on the cap layer, wherein the epitaxial layer is formed by HVPE.

9. The method of claim 8 wherein the buffer layer and the cap layer are formed by MBE.

10. The method of claim 8, wherein said step c) is performed by a process selected from the group consisting of MBE, sputtering and a CVD process other than HVPE.

11. The method of claim 8, further comprising the step of:

e) removing a portion of the heterostructure from the substrate.

12. The method of claim 8, wherein the substrate comprises a material selected from the group consisting of sapphire, silicon, silicon carbide, and gallium arsenide; the buffer layer comprises AlN; and the epitaxial layer comprises GaN.

13. The method of claim 8, wherein the buffer layer and the epitaxial layer have a combined thickness in the range of 1.0 micron to 500 micron.

14. The method of claim 8, wherein the epitaxial layer has a thickness in the range of 1.0 micron to 500 micron.

15. The method of claim 8, wherein the buffer layer and the cap layer are formed by CVD.

16. The method of claim 8, wherein the epitaxial layer has the same composition as the cap layer.

17. The method of claim 16 wherein the cap layer merges with the epitaxial layer.

18. The method of claim 16 wherein the cap layer protects the buffer layer against exposure to the atmosphere.

19. A method of making a semiconductor heterostructure, comprising the steps of:

a) providing a substrate;

b) forming a nitride buffer layer on the substrate to form a buffer-layered substrate, wherein the buffer layer is formed by a first deposition technique;

c) forming a cap layer on the buffer layer; and d) forming an epitaxial layer on the cap layer by a second deposition technique, wherein the second deposition technique is different from the first deposition technique.

20. The method of claim 19, wherein said step c) is performed by MOCVD and said step d) is performed by HVPE.

21. The method of claim 19, wherein the cap layer comprises a nitride of an element of group III or group IV of the periodic table.

22. The method of claim 19, wherein the cap layer and the epitaxial layer each comprise a metal nitride comprising at least one metal selected from the group consisting of silicon, gallium, aluminum, and indium.

\* \* \* \* \*

UNITED STATES PATENT AND TRADEMARK OFFICE
CERTIFICATE OF CORRECTION

PATENT NO. : 6,566,256 B1
DATED : May 20, 2003
INVENTOR(S) : Glenn S. Solomon et al.

It is certified that error appears in the above-identified patent and that said Letters Patent is hereby corrected as shown below:

<u>Title page,</u>
Item [73], Assignees, should read:
-- CBL Technologies, Inc. Redwood City, CA; Matsushita Electric Industrial Co., Ltd Osaka, JP --

Signed and Sealed this

Seventeenth Day of February, 2004

JON W. DUDAS
*Acting Director of the United States Patent and Trademark Office*